United States Patent
Phillips

(10) Patent No.: US 7,032,285 B2
(45) Date of Patent: Apr. 25, 2006

(54) MOUNTING AN OLED DONOR SHEET TO FRAMES

(75) Inventor: Bradley A. Phillips, Honeoye Falls, NY (US)

(73) Assignee: Eastman Kodak Company, Rochester, NY (US)

( * ) Notice: Subject to any disclaimer, the term of this patent is extended or adjusted under 35 U.S.C. 154(b) by 86 days.

(21) Appl. No.: 10/791,010

(22) Filed: Mar. 2, 2004

(65) Prior Publication Data

US 2005/0193543 A1     Sep. 8, 2005

(51) Int. Cl.
*B23Q 3/00* (2006.01)

(52) U.S. Cl. ............... 29/464; 29/446; 29/450; 29/466

(58) Field of Classification Search ............ 29/464, 29/466, 446, 450; 40/781
See application file for complete search history.

(56) References Cited

U.S. PATENT DOCUMENTS

| | | | | |
|---|---|---|---|---|
| 3,241,874 A | * | 3/1966 | Russell et al. | 292/357 |
| 3,341,887 A | * | 9/1967 | Tolmie | 16/430 |
| 3,357,730 A | * | 12/1967 | Siler | 403/408.1 |
| 4,083,100 A | * | 4/1978 | Flint et al. | 29/622 |
| 4,390,172 A | * | 6/1983 | Gotman | 269/56 |
| 4,672,732 A | * | 6/1987 | Ramspacher et al. | 29/429 |
| 4,776,822 A | * | 10/1988 | Dougherty et al. | 445/45 |
| 4,944,082 A | * | 7/1990 | Jones et al. | 29/467 |
| 5,056,251 A | * | 10/1991 | Connor et al. | 40/661 |
| 5,121,563 A | * | 6/1992 | Connor et al. | 40/661 |
| 5,148,618 A | * | 9/1992 | Brewster | 40/626 |
| 5,265,357 A | * | 11/1993 | Yu | 40/714 |
| 5,688,551 A | | 11/1997 | Littman et al. | |
| 5,742,129 A | | 4/1998 | Nagayama et al. | |
| 5,851,709 A | | 12/1998 | Grande et al. | |
| 5,862,583 A | * | 1/1999 | Ammann et al. | 29/559 |
| 5,937,272 A | | 8/1999 | Tang | |
| 6,114,088 A | | 9/2000 | Wolk et al. | |
| 6,140,009 A | | 10/2000 | Wolk et al. | |
| 6,214,520 B1 | | 4/2001 | Wolk et al. | |
| 6,221,553 B1 | | 4/2001 | Wolk et al. | |

FOREIGN PATENT DOCUMENTS

EP    1 028 001    8/2000
EP    1 344 652 A2    9/2003

OTHER PUBLICATIONS

Patent Abstracts of Japan vol. 2000, No. 12, Jan. 3, 2001 & JP 2000 252651 A, Sep. 14, 2000 abstract.
Patent Abstracts of Japan vol. 1998, No. 5, Apr. 30, 1998 & JP 10 016185 A, Jan. 20, 1998 abstract.

* cited by examiner

*Primary Examiner*—Essama Omgba
(74) *Attorney, Agent, or Firm*—Raymond L. Owens

(57) ABSTRACT

A method of securing a flexible donor sheet, before or after organic material has been transferred to such sheet to facilitate its mounting, includes forming a plurality of spaced apart openings in the sheet adjacent to opposite edges of the sheet, and providing a rigid frame for receiving the sheet having a plurality of tabs, each one of the tabs corresponding to an opening in the sheet and arranged so that an edge portion of the sheet adjacent to the opening is placed under its corresponding tab.

4 Claims, 4 Drawing Sheets

MOUNTING AN OLED DONOR SHEET TO FRAMES

CROSS REFERENCE TO RELATED APPLICATIONS

Reference is made to commonly assigned U.S. patent application Ser. No. 10/021,410 filed Dec. 12, 2001, entitled "Apparatus for Permitting Transfer of Organic Material From a Donor to Form a Layer in an OLED Device" by Bradley A. Phillips et al. and to commonly assigned U.S. patent application Ser. No. 10/790,995 filed Mar. 2, 2004 by Bradley A. Phillips, entitled "OLED Donor Sheet Having Rigid Edge Frame"; the disclosures of which are incorporated herein by reference.

FIELD OF THE INVENTION

The present invention relates to a way of mounting a flexible donor sheet to a frame for use in the manufacture of OLED devices.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium can include one or more layers of organic thin films, where one of the layers or regions within a layer is primarily responsible for light generation or electroluminescence. This particular layer is generally referred to as the light-emitting layer of the organic EL medium. Other organic layers present in the organic EL medium commonly facilitate electronic transportation, and are referred to as either the hole-transporting layer (for hole conduction) or electron-transporting layer (for electron conduction). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision (hole position of −5 micrometers) for accurately forming EL devices.

A method for patterning high-resolution organic EL displays has been disclosed in U.S. Pat. No. 5,851,709 by Grande et al. This method is comprised of the following sequences of steps: 1) providing a donor substrate having opposing first and second surfaces; 2) forming a light-transmissive, heat-insulating layer over the first surface of the donor substrate; 3) forming a light-absorbing layer over the heat-insulating layer; 4) providing the donor substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This produces many of the same problems as the shadow mask method, including the requirement for precision mechanical alignment between the donor substrate and the display substrate. A further problem is that the donor pattern is fixed and cannot be changed readily.

Using an unpatterned donor sheet and a precision light source, such as a laser can remove some of the difficulties seen with a patterned donor. Such a method is disclosed by Littman et al. in U.S. Pat. No. 5,688,551, and in a series of patents by Wolk et al. (U.S. Pat. Nos. 6,114,088; 6,140,009; 6,214,520; and 6,221,553).

In commonly assigned U.S. Pat. No. 5,937,272, Tang has taught a method of patterning multicolor pixels (e.g. red, green, and blue subpixels) onto a thin-film-transistor (TFT) array substrate by vapor deposition of an EL material. Such EL material can be precoated on one surface of a donor support material and transferred to a substrate by vapor deposition in a selected pattern (as in FIGS. 4, 5, and 6 in the aforementioned U.S. Pat. No. 5,937,272).

The EL material transfer is preferably done in a vacuum chamber such as Tang describes in the aforementioned patent and, in particular, vacuum is preferably maintained between the donor and substrate. The donor and substrate must also be kept in close proximity during the EL transfer (less than 250 micrometers between the coating and raised portions of the substrate as taught by Tang). Furthermore, the donor can be in contact with the raised portions of the substrate and thereby maintain sufficient spacing between the coating and the recessed portions of the substrate where the EL material is deposited. A method of holding the donor and substrate in contact in a vacuum chamber while maintaining vacuum between the donor and substrate is required.

Isberg et al., in commonly assigned European Patent Application 1 028 001 A1, have disclosed the additional use of an adhesion-promoting layer between the donor layer and substrate. While this would help promote the close contact required by Tang, it would be disadvantageous because the adhesion-promoting layer can introduce impurities in the form of the adhesive. Mechanical pressure, such as that applied by a manual plate, can be used but is difficult to maintain evenly over the entire surface for the micrometer-order tolerances needed. Pressure from air or other fluids would work better, but the use of such pressure is made difficult in that the conditions in the vacuum chamber need to remain undisturbed. Also, in using fluidic pressure to maintain close contact, lack of donor sheet flexibility can inhibit conformal close contact with the substrate surface while, at the same time, a flexible donor sheet can be difficult to handle and mount.

SUMMARY OF THE INVENTION

It is therefore an object of the present invention to provide a simplified way of mounting a flexible donor sheet to a rigid frame prior to transfer of organic material to an OLED device.

This object is achieved by a method of securing a flexible donor sheet, before or after organic material has been transferred to such sheet, to facilitate its mounting, comprising:

a) forming a plurality of spaced apart openings in the sheet adjacent to opposite edges of the sheet; and b) providing a rigid frame for receiving the sheet having a plurality of tabs, each one of the tabs corresponding to an opening in the sheet and arranged so that an edge portion of the sheet adjacent to the opening is placed under its corresponding tab.

ADVANTAGES

The present invention, by providing openings in the flexible donor sheet, facilitates their mounting on a rigid frame having corresponding protrusions in the form of tabs. This provides a simple way to rigidly support a flexible donor sheet for subsequent handling and mounting in the OLED device manufacturing process. The present invention limits the introduction of additional parts or materials into the process environment, which could be the source of process and device contamination.

DETAILED DESCRIPTION OF THE INVENTION

Figure 1:
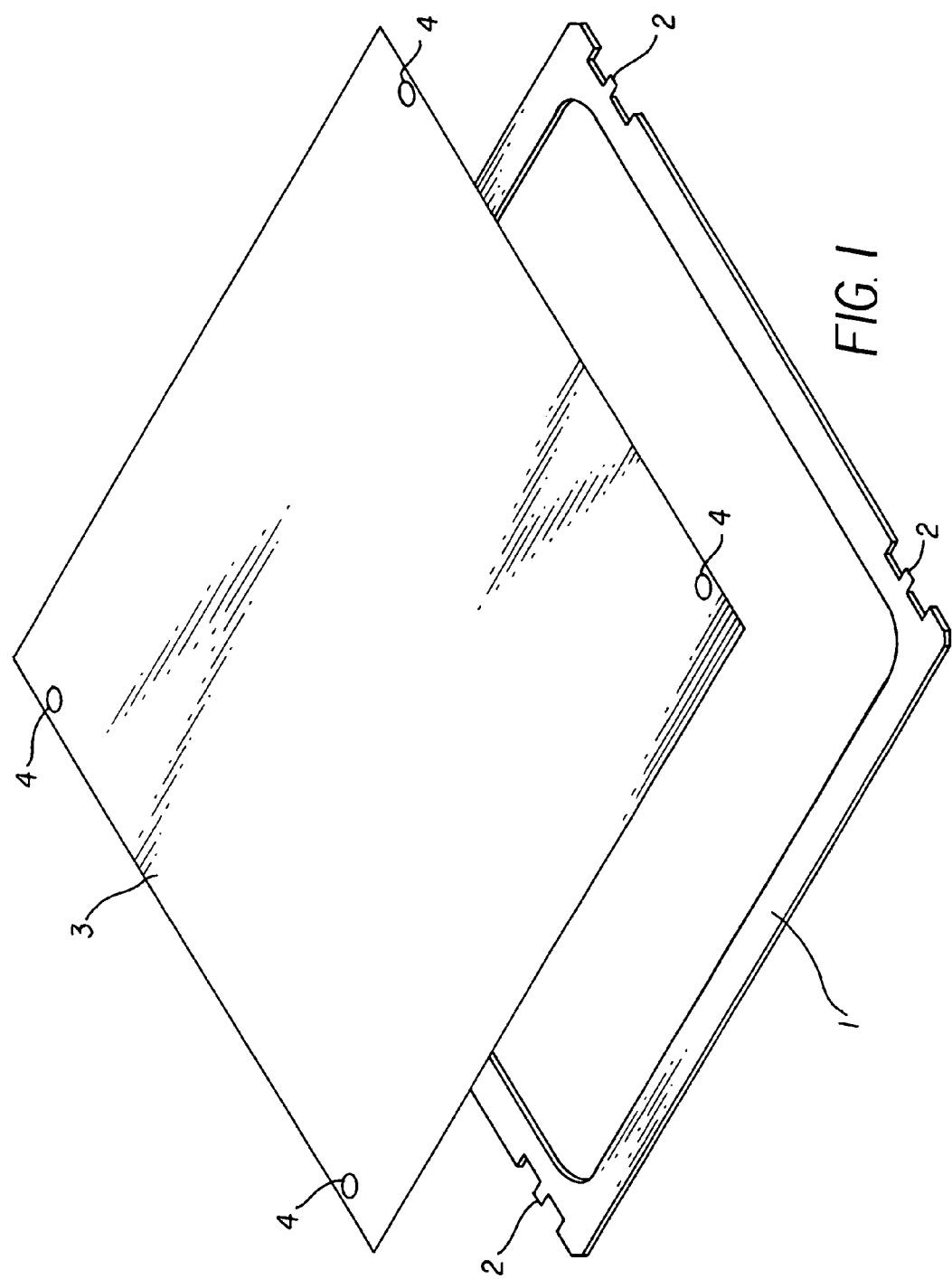
FIG. 1 is a perspective showing a flexible donor sheet with spaced apart openings along opposite edges and a rigid frame with corresponding tabs prior to mounting.

Turning now to FIG. 1, a donor sheet 3 is shown. It will be understood that donor sheet 3 has previously had organic material formed on it or is capable of receiving organic material. The donor sheet 3 is mounted in an OLED manufacturing process that permits subsequent processing such as forming an electrode or protective layer. It will be understood that if donor sheet 3 was formed prior to deposition of organic material, such material will have to be formed on donor sheet 3 prior to subsequent manufacturing processes. This can be accomplished by transfer of the organic material to an OLED device generally by absorbing heat from a laser beam. Donor sheet 3 is capable of receiving a light absorbing layer prior to receiving organic material for producing heat. The donor sheet 3 typically is made of a thin flexible polymer material, such as Kapton® or Estar®. Flexibility is important to permit donor sheet 3 to more readily conform to the surface of an OLED device during the transfer of organic material. It also permits the donor material to be in web form for easier storage (as a roll) and upstream handling and processing. When donor sheet 3 is used for thermal transfer of organic materials, a laser beam impinges upon the sheet and a heat-absorbing layer converts the laser energy into heat, which causes the transfer of the OLED material.

The donor sheet 3 is shown formed with a plurality of spaced apart openings 4 in the sheet along opposite edges of the sheet. Also shown is rigid frame 1 with a plurality of protrusions shown in the forms of tabs 2. Rigid frame 1 can be made of stainless steel or other appropriate rigid material (other metals or plastics) and can be fabricated from machining or molding processes. Openings 4 can be formed by a punching operation or other method and are positioned to align with corresponding tabs 2. The donor sheet 3 is mounted to rigid frame 1 by engaging openings 4 with tabs 2 in a way that permits donor sheet 3 to be fully secured to rigid frame 1. More particularly, openings 4 along an edge of donor sheet 3 are aligned with corresponding tabs 2 along an edge of rigid frame 1. The edge portions of donor sheet 3 adjacent to openings 4 are placed under the corresponding tabs 2 to secure the edge of donor sheet 3 to rigid frame 1. Donor sheet 3 is then shifted towards the opposite edge of rigid frame 1 to permit the opposite edge of donor sheet 3 to be secured to rigid frame 1 in the same manner. In this way, donor sheet 3 is fully secured to rigid frame 1. Opening 4 and tab 2 can be formed as shown or of various shapes and sizes suitable for easy assembly and reliable retention. Preferably, there are at least two spaced apart openings 4 at opposite edges of donor sheet 3 which correspond to tabs 2 in the rigid frame 1.

Figure 2:
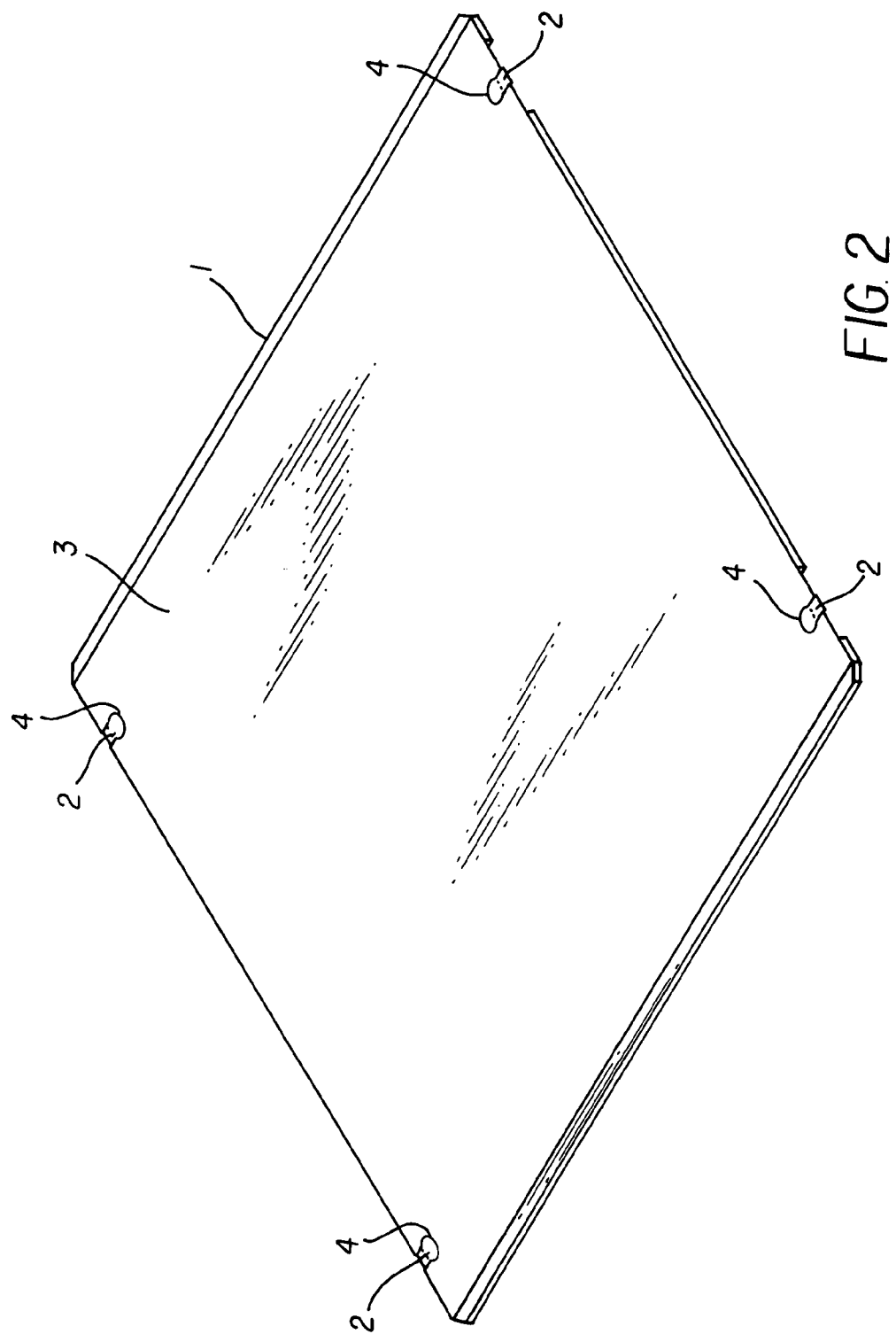
FIG. 2 is a perspective showing a flexible donor sheet with spaced apart openings engaged with tabs in the rigid frame.
Figure 3:
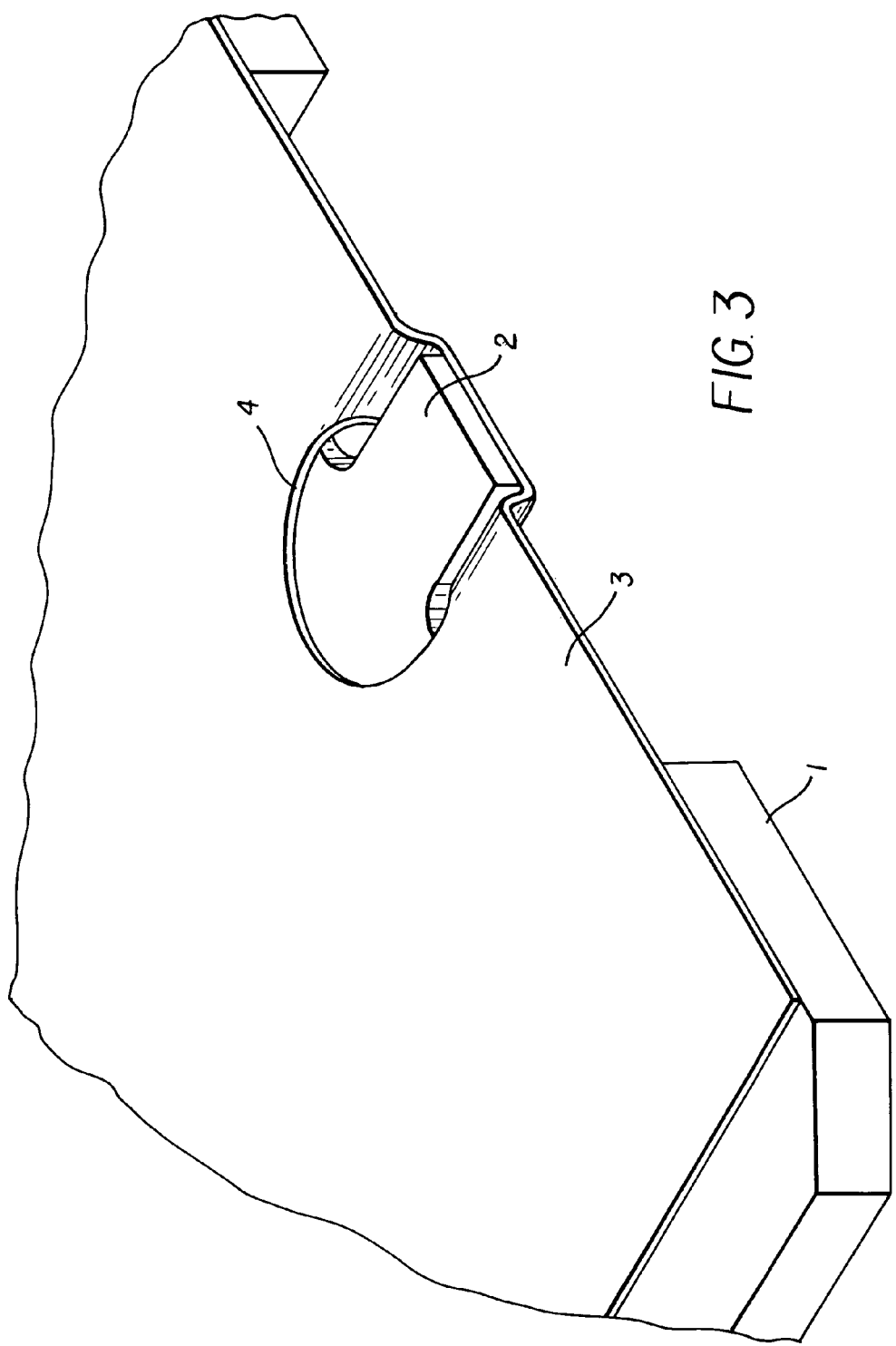
FIG. 3 is a perspective showing in more detail a flexible donor sheet engaged with a tab of the rigid frame.

FIG. 2 shows donor sheet 3 mounted to rigid frame 1 by means of openings 4 and tabs 2. FIG. 3 is a detail of FIG. 2 showing how opening 4 engages with tabs 2 in a way that provides reliable retention of donor sheet 3 to rigid frame 1.

Figure 4:
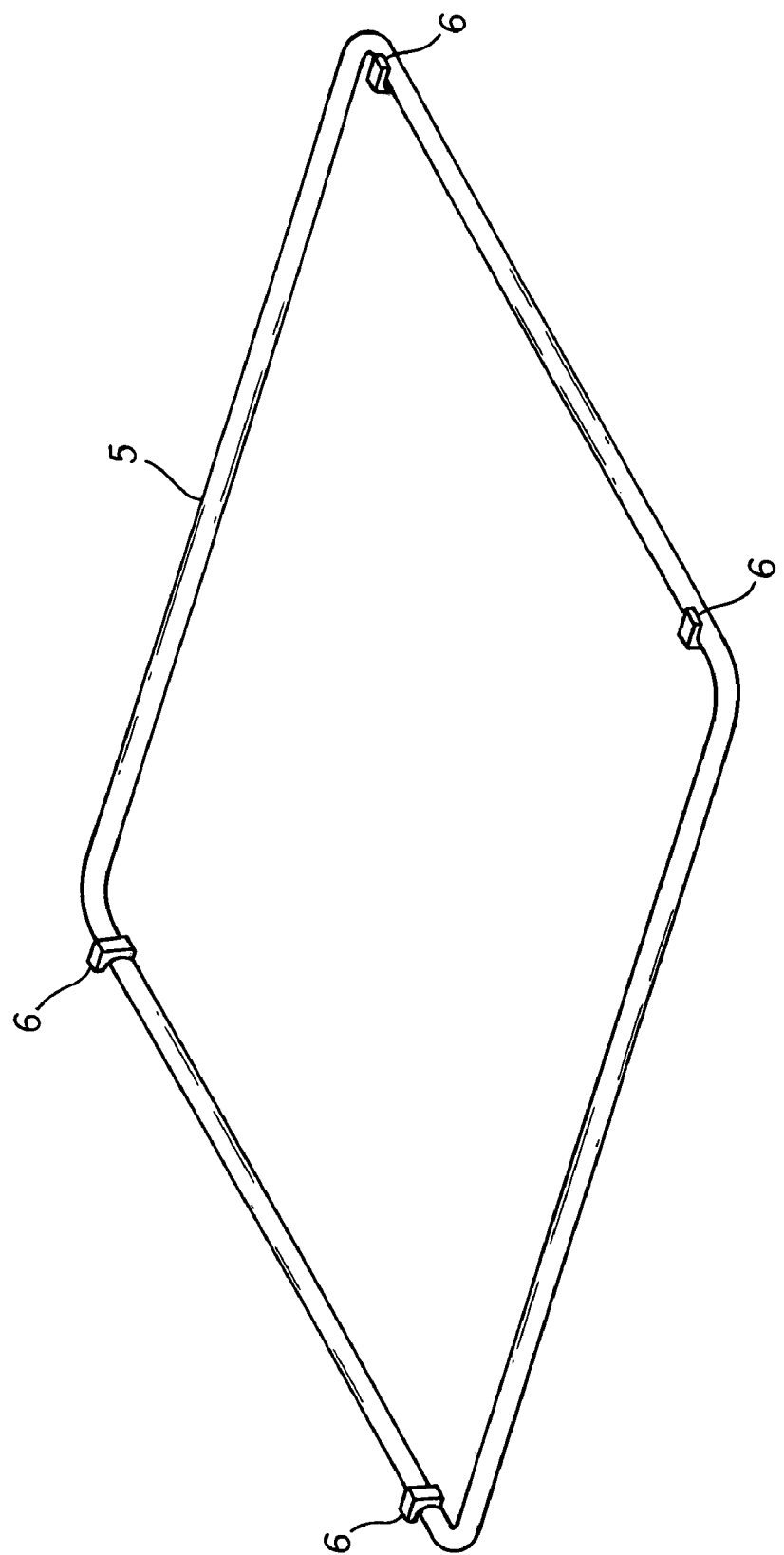
FIG. 4 is a perspective of another embodiment of the present invention, which is similar to the embodiment shown in FIGS. 1–3, but wherein the frame is a rigid wire frame formed with tabs.

FIG. 4 shows rigid wire frame 5 with tabs 6 that can also be used to provide a rigid support for donor sheet 3. Wire frame 5 can be made from stock stainless steel dowel rod (or other appropriate stock material), which has the appropriate wire diameter (e.g. 0.060" diameter). The stock material is cut to length and formed into a closed rectangular shape that is sized for use with donor sheet 3. The joined ends of wire frame 5 can be bonded in some appropriate manner (welded, soldered, glued, etc.). Tabs 6 can be, in form, substantially identical to tabs 2 as shown in the first embodiment (FIGS. 1–3). The mounting of donor sheet 3 on the wire frame 5 is the same process described above with the first embodiment.

The invention has been described in detail with particular reference to certain preferred embodiments thereof, but it will be understood that variations and modifications can be effected within the spirit and scope of the invention.

PARTS LIST rigid frame
tab
donor sheet
opening
wire frame
tab

The invention claimed is:

1. A method of securing a flexible donor sheet, before or after organic material has been transferred to such sheet to facilitate its mounting, comprising:

a) forming a plurality of spaced apart openings in the flexible donor sheet adjacent to opposite edges of the sheet; and b) providing a rigid frame defining a central opening to permit heating and transfer of organic material from the flexible donor sheet to a substrate, the rigid frame having a plurality of tabs extending outwardly on opposite sides of the rigid frame, each one of the tabs corresponding to one of the spaced apart openings in the flexible donor sheet and, placing the donor sheet on top of the rigid frame, at each spaced apart opening, elastically deforming an edge portion of the flexible donor sheet adjacent the opening, and sliding a tab in the opening such that the elastically deformed edge portion of the flexible donor sheet adjacent the opening is placed under the tab, thereby securing the flexible donor sheet to the rigid frame.

2. The method according to claim 1 wherein there are at least two spaced apart openings at opposite edges of the flexible donor sheet which correspond to tabs in the rigid frame.

3. A method of securing a flexible donor sheet, before or after organic material has been transferred to such sheet to facilitate its mounting, comprising:
   a) forming a plurality of spaced apart openings in the flexible donor sheet adjacent to opposite edges of the sheet; and
   b) providing a rigid wire frame defining a central opening to permit heating and transfer of organic material from the flexible donor sheet to a substrate, the rigid frame having a plurality of tabs extending outwardly on opposite sides of the rigid frame, each one of the tabs corresponding to one of the spaced apart openings in the flexible donor sheet and, placing the donor sheet on top of the rigid wire frame, at each spaced apart opening, elastically deforming an edge portion of the flexible donor sheet adjacent the opening, and sliding a tab in the opening such that the elastically deformed edge portion of the flexible donor sheet adjacent the opening is placed under the tab, thereby securing the flexible donor wire frame.

4. The method according to claim 3 wherein there are at least two spaced apart openings in opposite edges of the flexible donor sheet which correspond to tabs in the rigid wire frame.

* * * * *

UNITED STATES PATENT AND TRADEMARK OFFICE
CERTIFICATE OF CORRECTION

PATENT NO.         : 7,032,285 B2                                          Page 1 of 1
APPLICATION NO. : 10/791010
DATED              : April 25, 2006
INVENTOR(S)       : Bradley A. Phillips It is certified that error appears in the above-identified patent and that said Letters Patent is hereby corrected as shown below:

Column 6, line 8,        Delete the word "and"
Column 6, line 15,       Please add --sheet to the rigid-- after "flexible donor"

Signed and Sealed this

Twenty-eighth Day of November, 2006

JON W. DUDAS
*Director of the United States Patent and Trademark Office*